United States Patent
Sekiya et al.

(10) Patent No.: US 7,550,387 B2
(45) Date of Patent: Jun. 23, 2009

(54) SEMICONDUCTOR WAFER PROCESSING METHOD

(75) Inventors: Kazuma Sekiya, Ota-Ku (JP); Yusuke Kimura, Ota-ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/180,283

(22) Filed: Jul. 25, 2008

(65) Prior Publication Data

US 2009/0061599 A1    Mar. 5, 2009

(51) Int. Cl.
*H01L 21/00* (2006.01)
(52) U.S. Cl. .................. 438/690; 438/691; 438/659
(58) Field of Classification Search .................. 451/28; 438/690, 691, 959, FOR. 119
See application file for complete search history.

(56) References Cited

FOREIGN PATENT DOCUMENTS

| JP | A 9-82616 | 3/1997 |
|----|-----------|--------|
| WO | WO 2004/053967 A1 | 6/2004 |

*Primary Examiner*—Evan Pert
*Assistant Examiner*—Tan N Tran
(74) *Attorney, Agent, or Firm*—Greer, Burns & Crain, Ltd.

(57) ABSTRACT

A semiconductor wafer processing method for planarizing an additional layer formed on the front side of a semiconductor wafer. First, the wafer is held on a chuck table included in a cutting device in the condition where the additional layer is exposed, and a table base supporting the chuck table is moved toward a working position. In concert with the movement of the table base, the exposed surface of the additional layer is cut by a bit of a cutting tool rotationally driven by a spindle motor. Thereafter, the exposed surface of the additional layer is polished by a polishing device to planarize the exposed surface of the additional layer.

2 Claims, 7 Drawing Sheets

SEMICONDUCTOR WAFER PROCESSING METHOD

BACKGROUND OF THE INVENTION

1. Field of the Invention

The present invention relates to a method of processing an additional layer such as an insulating film formed on the front side of a wafer such as a semiconductor wafer.

2. Description of the Related Art

In a semiconductor device such as a main computing device (MPU) and a memory device (e.g., DRAM) for a computer, the scale of integration is increased with a reduction in size and thickness of various electronic equipment incorporating the semiconductor device. Such a semiconductor device can be obtained by forming many devices on the front side of a semiconductor wafer such as a silicon wafer and separating the wafer into these devices. With an increase in scale of integration in a semiconductor device, it becomes necessary to form a multilayer structure of wiring layers on the front side of the wafer in order to further increase the scale of integration, increase an operating speed, and ensure design flexibility. In the case of forming such a multilayer structure of wiring layers, these wiring layers stacked must be insulated from each other, and an insulating film is therefore formed on the upper surface of each wiring layer by any film deposition method such as chemical vapor deposition (CVD) and spin coating.

The insulating film is first planarized by any method such as chemical mechanical polishing (CMP), and the wiring layer is next formed on the upper surface of the insulating film by photolithography. By repeating this process, a multilayer structure of wiring layers is formed on the wafer. If the insulating film is not planarized, a focal position of light on the insulating film in an exposure step of the photolithography does not become constant, so that the thickness of each wire does not become constant. For this reason, the insulating film must be planarized prior to forming the wiring layer. As a technique of planarizing the insulating film, a cutting method using a bit is known (see Japanese Patent Laid-open No. 9-82616). Also known is a cutting method including the step of flat grinding the back side of a wafer functioning as a reference surface in cutting the insulating film by using a bit, so as to improve the flatness of the insulating film (see WO2004-053967).

In recent years, the thickness of an insulating film having a low dielectric constant tends to be increased, so that the amount of processing of the insulating film is increased. Accordingly, if the insulating film is processed by only CMP, a processing cost is increased in proportion to the amount of processing. In the case that the insulating film is cut by using a bit to reduce the thickness as in the prior art mentioned above, the processing cost can be reduced as compared with the case of adopting only CMP. However, the flatness (smoothness) of the finished surface of the insulating film by the cutting using the bit is lower than that by CMP. Further, in the case of cutting the insulating film by using the bit, the wafer is fixed to a holding table with reference to the back side of the wafer, and the front side of the wafer is cut in this fixed condition. Accordingly, the cutting using the bit is not suitable for such processing that the thickness of the insulating film is made constant with reference to the front side of the wafer.

SUMMARY OF THE INVENTION

It is therefore an object of the present invention to provide a semiconductor wafer processing method in which an insulating film can be efficiently planarized to thereby realize a reduction in processing time and a reduction in cost.

In accordance with an aspect of the present invention, there is provided a semiconductor wafer processing method for planarizing an additional layer formed on the front side of a semiconductor wafer, the semiconductor wafer processing method including a semiconductor wafer holding step of holding the semiconductor wafer by using holding means included in a cutting device in the condition where the front side of the semiconductor wafer is exposed, the cutting device including a rotating member and a cutting member supported to the rotating member, the cutting member forming a cut surface, the holding means having a holding surface on which the semiconductor wafer is held, the angle of the holding surface to the cut surface being adjustable to substantially zero; an additional layer cutting step of flat cutting the additional layer formed on the front side of the semiconductor wafer by using the cutting member rotating with the rotating member; and an additional layer polishing step of polishing the additional layer after the additional layer cutting step.

According to the present invention, the semiconductor wafer is held by the holding means so that the front side of the semiconductor wafer is substantially parallel to the cut surface by the cutting member. In this condition, the additional layer formed on the front side of the semiconductor wafer is cut by the cutting member in the additional layer cutting step, and next polished in the additional layer polishing step to thereby planarize the exposed surface of the additional layer having a predetermined thickness. Most of the total amount of processing of the additional layer is removed in the additional layer cutting step, thereby reducing a processing time as compared with the case that the additional layer is processed by only polishing such as CMP. Further, the remaining amount of processing of the additional layer is removed in the additional layer polishing step, so that the flatness of the exposed surface of the additional layer after polishing can be improved as compared with the case that the exposed surface is finished by only the cutting member.

Preferably, the total amount of processing of the additional layer by the additional layer cutting step and the additional layer polishing step is more than 3 μm, and the amount of cutting of the additional layer by the additional layer cutting step is 2 μm or more. In the case that the total amount of processing of the additional layer is about 1 μm, the processing cost can be suppressed because of such a small processing amount even by only the additional layer polishing step whose processing cost is relatively high. However, in the case that the total processing amount is about 3 μm or more, the processing cost becomes high if only the additional layer polishing step is adopted. Under these circumstances, most of the total amount of processing of the additional layer is removed by the additional layer cutting step whose processing cost is relatively low in the condition where 1 μm is left as the amount of processing of the additional layer by the additional layer polishing step, thereby reducing the cost.

Thus, the additional layer formed on the front side of the wafer is planarized by the combination of the additional layer cutting step and the additional layer polishing step. Accordingly, the processing time can be reduced and the processing cost can also be reduced. Furthermore, the exposed surface of the additional layer can be made flat.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A wafer processing method according to a preferred embodiment of the present invention will now be described with reference to the drawings. Reference numeral 1 shown in FIGS. 1A and 1B denotes a disk-shaped semiconductor wafer (which will be hereinafter referred to simply as a wafer). The wafer 1 is a silicon wafer, for example. A plurality of crossing streets 2 are formed on the front side (upper surface) 1a of the wafer 1 to partition a plurality of rectangular semiconductor chips (devices) 3. An electronic circuit such as IC or LSI (not shown) is formed on the front side of each semiconductor chip 3. Further, a V-shaped notch 4 for indicating the crystal orientation of a semiconductor is formed on the outer circumference of the wafer 1 at a predetermined position.

Figure 1A:
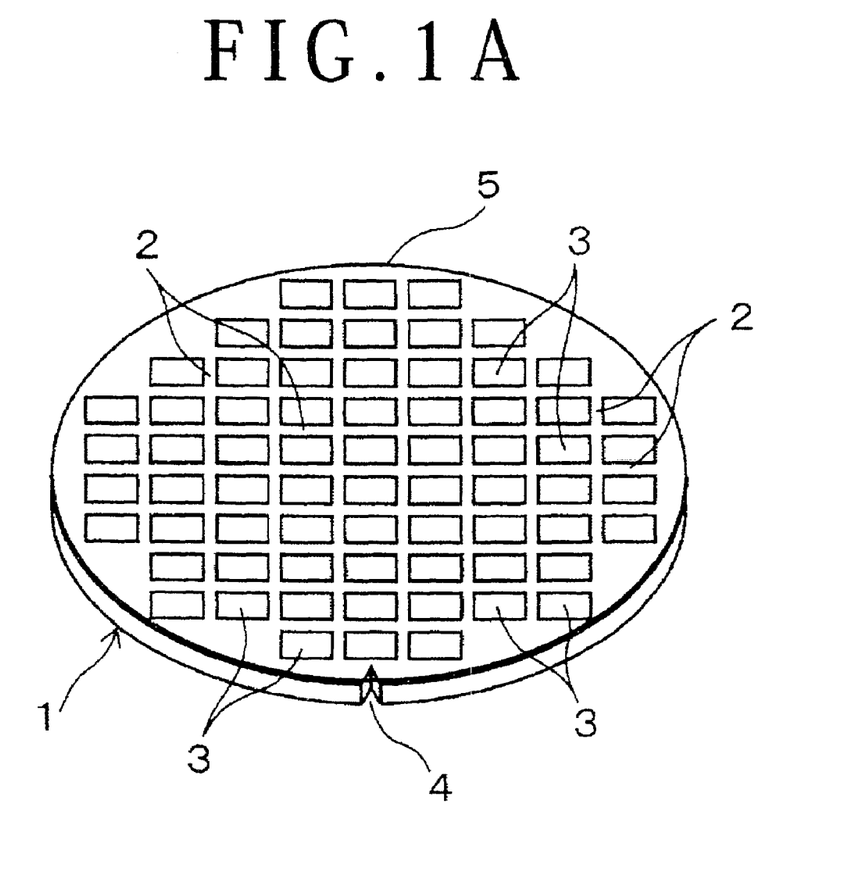
FIG. 1A is a perspective view of a semiconductor wafer having an additional layer to be processed by a wafer processing method according to a preferred embodiment of the present invention.
Figure 1B:
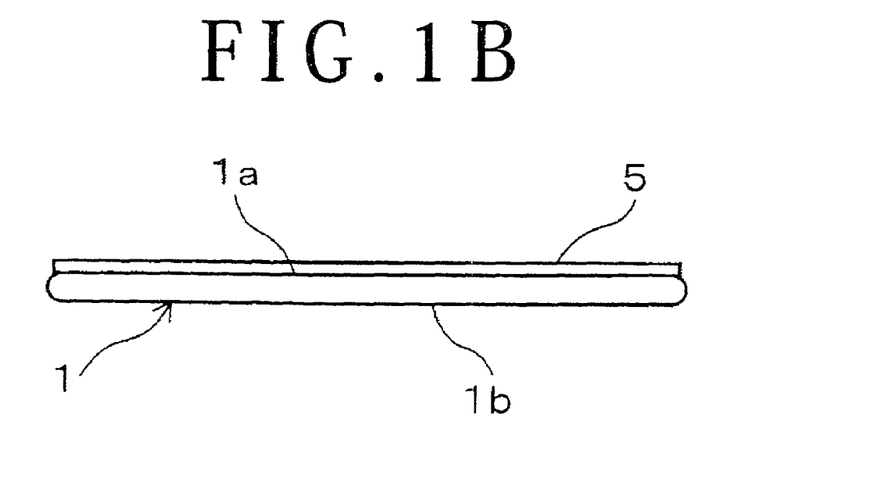
FIG. 1B is a side view of the semiconductor wafer shown in FIG. 1A.
Figure 2A:
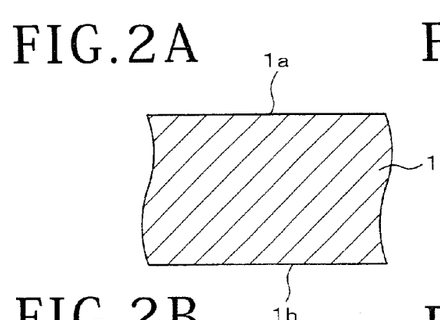
FIGS. 2A to 2G are sectional views for illustrating the wafer processing method according to the preferred embodiment in the case of forming a multilayer structure of additional layers.
Figure 2B:
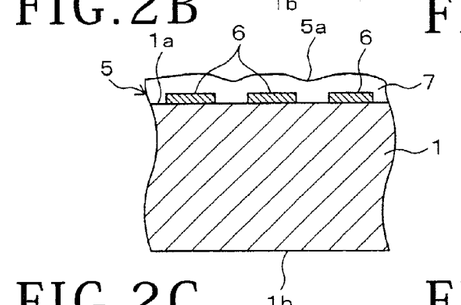

An additional layer (wiring layer) 5 is formed on the upper surface 1a of the wafer 1. As shown in FIG. 2B, the additional layer 5 is composed of metal wires 6 such as aluminum wires for connecting selected ones of metal electrodes (not shown) embedded in the wafer 1 shown in FIG. 2A and an insulating film 7 for covering the upper surface 1a of the wafer 1 and the metal wires 6. The additional layer 5 is formed by first forming the metal wires 6 by any film deposition method such as CVD and next forming the insulating film 7. The material of the insulating film 7 may include an insulating resin such as polyimide and a glass oxide film such as SOG (Spin On Glass) and BPSG (Boron Phosphorous Silicate Glass). In the case of using such an insulating resin or SOG, the insulating film 7 is formed by a spin coat method such that a liquid material is dropped onto the center of the upper surface 1a of the wafer 1 during rotation of the wafer 1 to thereby centrifugally spread the liquid material over the upper surface 1a of the wafer 1. In the case of using BPSG, the insulating film 7 is formed by any film deposition method such as CVD. The thickness of the insulating film 7 is set to about 1 to 5 µm, for example. As shown in FIGS. 1A and 1B, the additional layer 5 is formed on the upper surface 1a of the wafer 1 in the above condition. In FIG. 1A, the semiconductor chips 3 covered with the additional layer 5 are shown for the purpose of illustration.

Figures 2C, 2D, 2G:
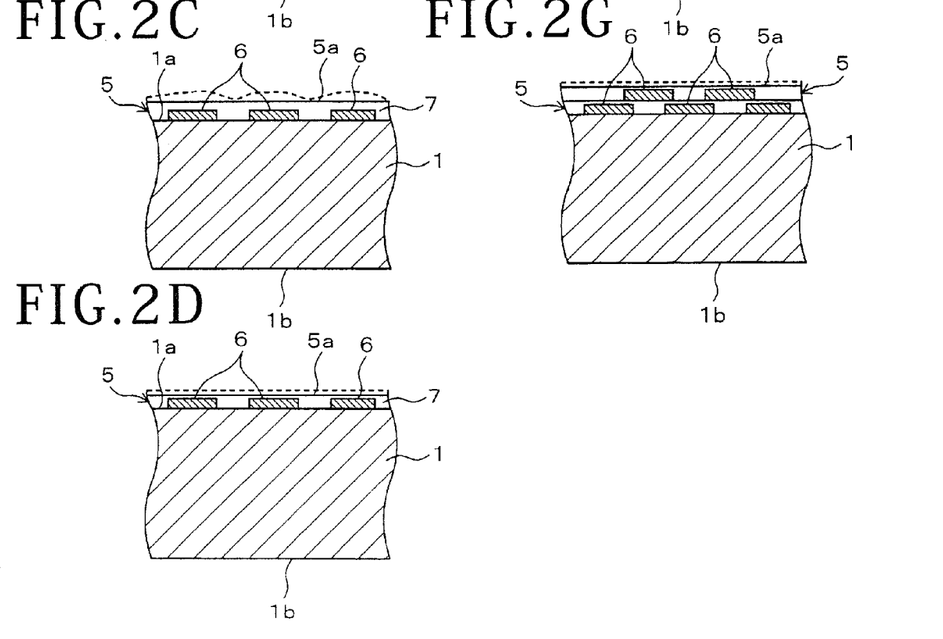

After forming the additional layer 5 on the upper surface 1a of the wafer 1 as shown in FIG. 2B, the upper surface 5a of the additional layer 5 (actually, the upper surface of the insulating film 7) is cut flat as shown in FIG. 2C. This cutting step is performed by using a cutting device 10 shown in FIG. 3. According to the cutting device 10, the back side (lower surface) 1b of the wafer 1 shown in FIG. 2B is placed on a suction surface of a vacuum chuck type chuck table 20 to thereby hold the wafer 1 on the chuck table 20, and the upper surface 5a of the additional layer 5 formed on the upper surface 1a of the wafer 1 is next cut flat by means of a bit (single point tool) 37 of a rotary cutting tool 35 of a cutting unit 30. As described later with reference to FIG. 4, the cutting tool 35 has an annular frame 36 and the bit 37 detachably mounted on the lower surface of the annular frame 36.

The configuration and operation of the cutting device 10 will now be described with reference to FIG. 3. The cutting device 10 includes a rectangular parallelepiped base 11. A supply cassette 12 for storing a plurality of wafers 1 in the stage shown in FIG. 2B is detachably set on the base 11 at a predetermined position. The plurality of wafers 1 are stacked in the supply cassette 12 in the condition where the upper surface 1a of each wafer 1 covered with the additional layer 5 is directed upward. One of the plural wafers 1 is drawn out of the supply cassette 12 by a pickup robot 13. The wafer 1 thus drawn out of the supply cassette 12 is placed on a positioning table 14 in the condition where the upper surface 1a of the wafer 1 is directed upward. Thus, the wafer 1 is positioned on the positioning table 14.

Figure 4:
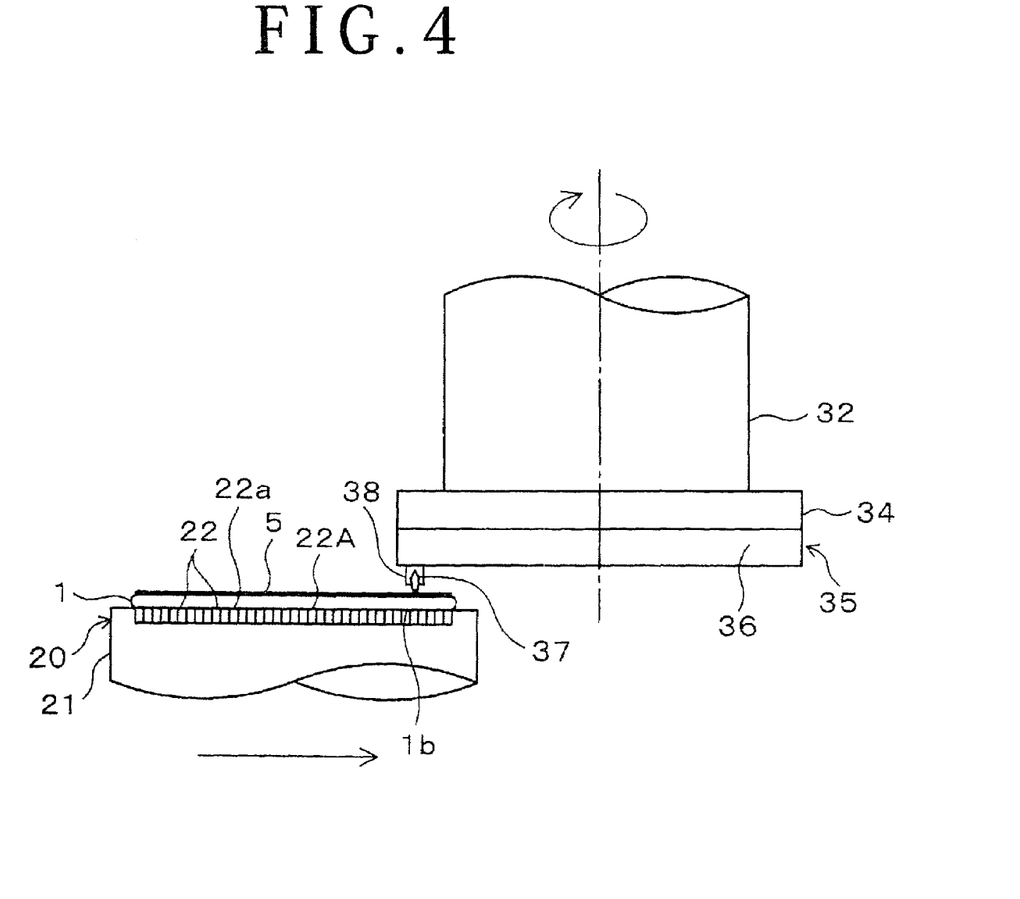
FIG. 4 is a side view showing a cutting unit and a chuck table both included in the cutting device shown in FIG. 3.

The wafer 1 positioned on the positioning table 14 is lifted by a supply arm 15 and is next concentrically placed on the disk-shaped chuck table 20 waiting at a mount/demount position under suction vacuum in the condition where the upper surface 1a of the wafer 1 is directed upward (semiconductor wafer holding step). As shown in FIG. 4, the chuck table 20 is of a pin chuck type such that a circular suction member 22A having many standing pins 22 is formed on the upper surface of a disk-shaped body 21 at a central portion thereof. The wafer 1 is held on the upper surface of the suction member 22A as a suction surface 22a in the condition where the lower surface 1b of the wafer 1 is kept in close contact with the suction surface 22a and the additional layer 5 formed on the upper surface 1a of the wafer 1 is exposed.

Figure 3:
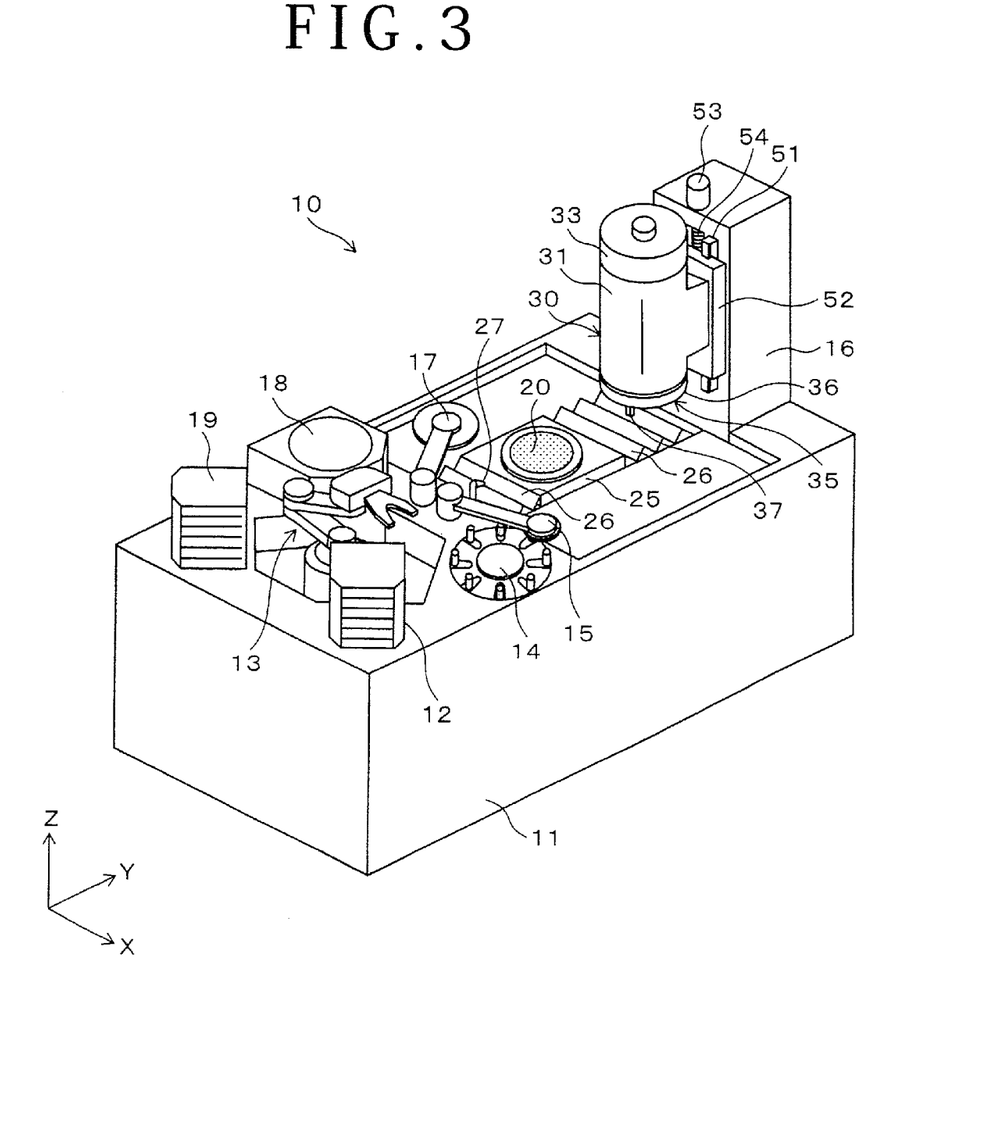
FIG. 3 is a perspective view of a cutting device to be used in the wafer processing method according to the preferred embodiment.

As shown in FIG. 3, a table base 25 is provided on the base 11 so as to be movable in the direction shown by an arrow Y. The chuck table 20 is unrotatably supported on the upper surface of the table base 25. By moving the table base 25 in the Y direction, the wafer 1 held on the chuck table 20 is moved from the mount/demount position shown in FIG. 3 to a working position shown in FIG. 4 where the wafer 1 is processed by the cutting tool 35. That is, the cutting unit 30 having the cutting tool 35 for cutting the upper surface 5a of the additional layer 5 formed on the upper surface 1a of the wafer 1 is located above the working position. Further, a bellows-like cover 26 for covering a moving path of the table base 25 to prevent the drop of chips or the like into the base 11 is provided on the base 11 so as to be expanded and contracted.

In the cutting unit 30, the bit 37 for actually cutting the additional layer 5 is rotated in a horizontal plane, so that a cut surface to be formed by the locus of rotation of a cutting part formed at the front end (lower end) of the bit 37 becomes horizontal. The body 21 of the chuck table 20 is pivotably supported to the table base 25, thereby making adjustable the angle of the suction surface 22a to the cut surface by the bit 37 in the following manner.

Figure 5A:
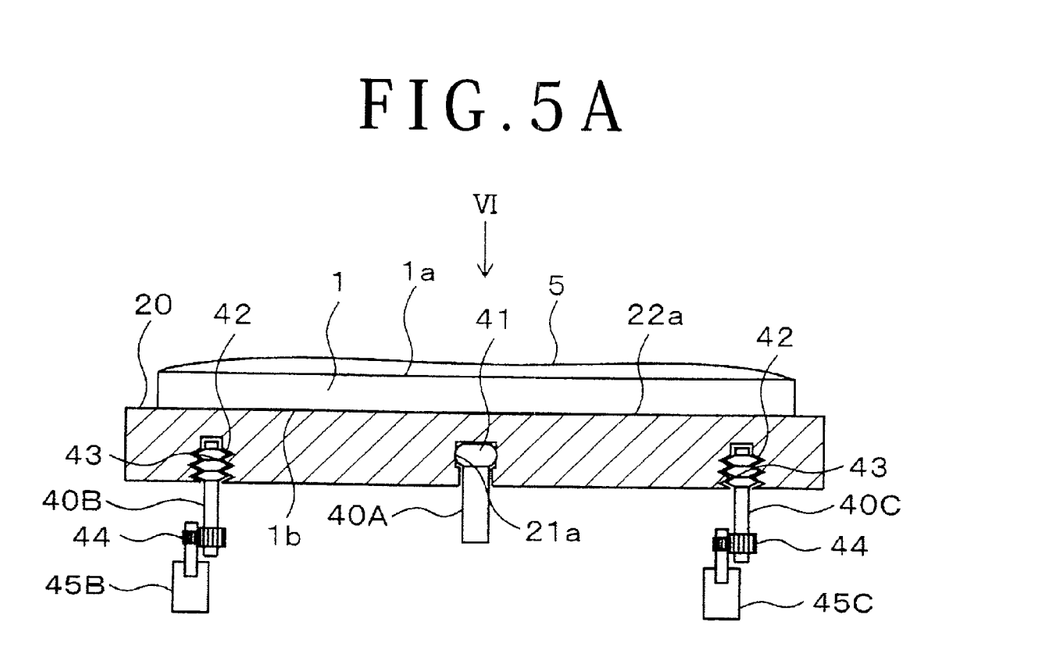
FIGS. 5A and 5B are sectional side views for illustrating a support structure for the chuck table shown in FIG. 3 and the operation of the support structure.
Figure 5B:
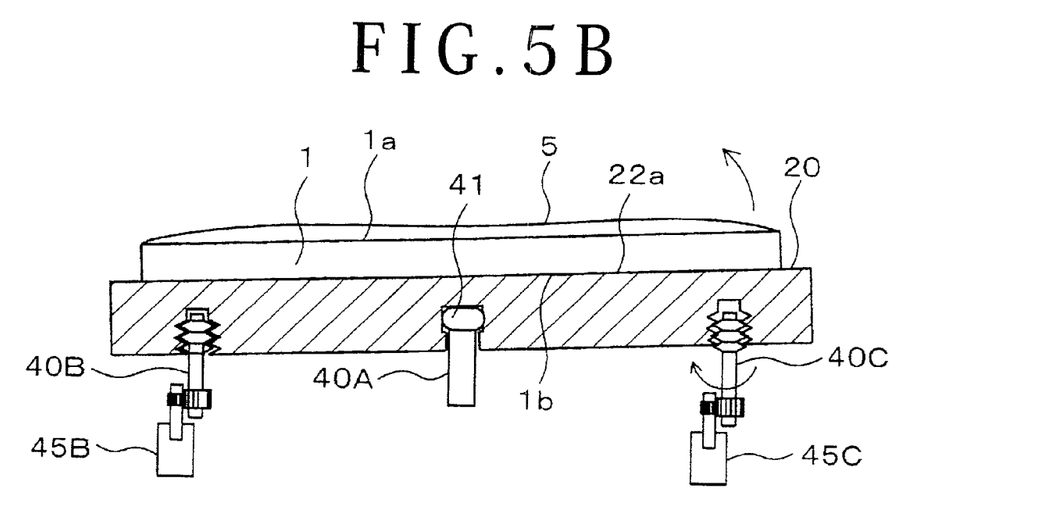
Figure 6:
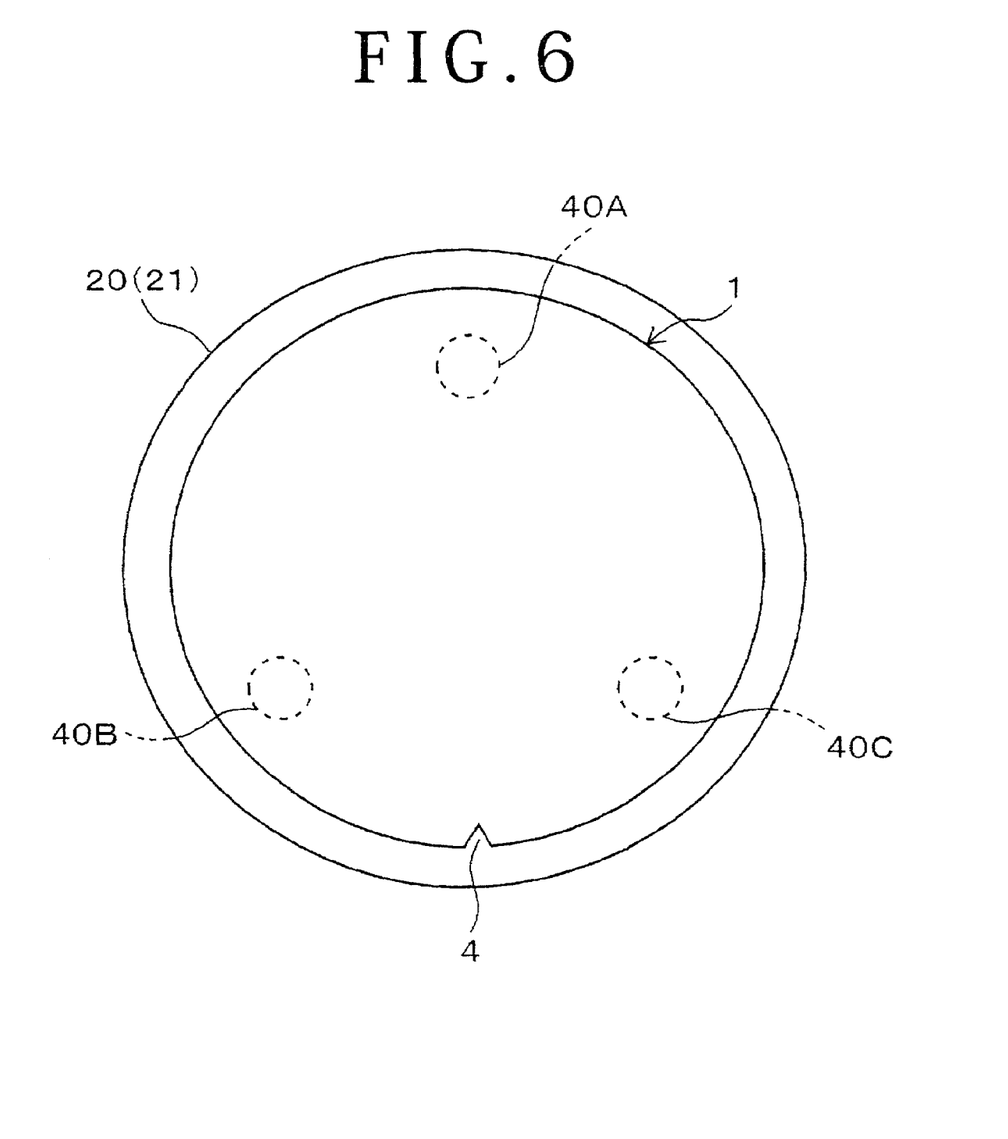
FIG. 6 is a view taken in the direction shown by an arrow VI in FIG. 5A.

As shown in FIGS. 5A, 5B, and 6, the body 21 of the chuck table 20 is supported by one fixed shaft 40A and two movable (rotatable) shafts, or first and second movable (rotatable) shafts 40B and 40C, all of these shafts 40A to 40C are built in the table base 25. All of these shafts 40A to 40C extend in the direction shown by an arrow Z in FIG. 3, and the center of the chuck table 20 coincides with the center of a regular triangle formed by connecting these shafts 40A to 40C located at the vertices as viewed in FIG. 6.

As shown in FIG. 5A, a pivot 41 is formed at the upper end of the fixed shaft 40A. The pivot 41 is fitted in a bearing hole 21a formed on the lower surface of the body 21 of the chuck table 20. Thus, the chuck table 20 is pivotable about the pivot 41. The first and second movable shafts 40B and 40C are mounted to the table base 25 so as to be rotatable about the respective axes and unmovable in the axial direction. Each of the movable shafts 40B and 40C has a threaded portion 42 at the upper end portion. The threaded portion 42 is threadedly engaged with a threaded hole 43 formed on the lower surface of the body 21. Further, a speed reduction gear train 44 is provided at the lower end portion of each of the movable shafts 40B and 40C. These movable shafts 40B and 40C are respectively rotated by motors 45B and 45C through the respective speed reduction gear trains 44.

When the first and second movable shafts 40B and 40C are rotated, the body 21 is lifted or lowered at the threadedly engaged portions, i.e., at the threaded holes 43 according to the rotational direction of each shaft, so that the chuck table 20 is pivotally moved about the pivot 41 of the fixed shaft 40A as shown in FIG. 5B. The chuck table 20 has a basic condition such that the suction surface 22a is horizontal. By suitably operating the two movable shafts 40B and 40C to pivotally move the chuck table 20, the angle of the suction surface 22a to the cut surface by the bit 37 of the cutting tool 35 in the cutting unit 30 can be changed. FIG. 5A shows a condition where the suction surface 22a of the chuck table 20 is horizontal, and FIG. 5B shows a condition where the suction surface 22a of the chuck table 20 is inclined by rotating the second movable shaft 40C in such a direction that the threaded portion 42 is disengaged from the threaded hole 43, thereby lifting the threadedly engaged portion of the body 21 of the chuck table 20.

Referring back to FIG. 3, a column 16 stands on the base 11 at its rear end portion in the Y direction as viewed in FIG. 3, and the cutting unit 30 is mounted on the front surface of the column 16 so as to be movable in the Z direction (vertical direction). A pair of right and left guides 51 (only the right one being shown) are provided on the front surface of the column 16 so as to extend in the Z direction, and the cutting unit 30 is slidably mounted on the guides 51 through a slider 52. The cutting unit 30 is movable with the slider 52 in the Z direction by a ball screw type feeding mechanism 54 driven by a servo motor 53.

As shown in FIGS. 3 and 4, the cutting unit 30 includes a cylindrical spindle housing 31 having an axis extending in the Z direction, a spindle shaft 32 coaxially and rotatably supported in the spindle housing 31, a spindle motor 33 coaxially fixed to the upper end of the spindle housing 31 for rotationally driving the spindle shaft 32, and a disk-shaped flange 34 coaxially fixed to the lower end of the spindle shaft 32. The cutting tool 35 is mounted on the lower surface of the flange 34.

The cutting tool 35 includes the annular frame 36 fixed to the lower surface of the flange 34 and the bit 37 detachably mounted through a shank 38 to the lower surface of the annular frame 36. The frame 36 is concentrically provided to the flange 34. The bit 37 is formed of diamond, carbide, etc., and has a cutting part for actually cutting a workpiece at the lower end. The cutting tool 35 is rotated together with the spindle shaft 32, and the outer diameter of the locus of rotation of the bit 37 about the axis of the spindle shaft 32 is set larger than the diameter of the wafer 1. As mentioned above, the cut surface formed by the locus of rotation of the cutting part of the bit 37 is set horizontal.

Prior to cutting the additional layer 5 by using the cutting unit 30, the suction surface 22a of the chuck table 20 is adjusted to a horizontal surface at the mount/demount position shown in FIG. 3, thereby setting the angle of the suction surface 22a to the cut surface by the bit 37 to zero, i.e., setting the suction surface 22a parallel to the cut surface by the bit 37. Since the thickness of the wafer 1 is uniform, the upper surface 1a of the wafer 1 (the surface covered with the additional layer 5) held on the suction surface 22a is set parallel to the cut surface by the bit 37, i.e., set horizontal by adjusting the suction surface 22a to a horizontal surface as mentioned above.

Thus, in the case that a variation in thickness of the wafer 1 falls within tolerance, the position of the wafer 1 held on the chuck table 20 can be adjusted to a horizontal position by setting the suction surface 22a of the chuck table 20 to a horizontal surface. However, in the case that the variation in thickness of the wafer 1 is out of tolerance (e.g., the variation in thickness not less than 3 μm), the upper surface 1a of the wafer 1 does not become parallel to the cut surface by the bit 37 even in the condition where the suction surface 22a of the chuck table 20 is horizontal. In this case, the variation in thickness of the wafer 1 is checked prior to forming the additional layer 5 on the upper surface 1a of the wafer 1, and according to the result of this checking the chuck table 20 is suitably inclined to adjust the angle of the suction surface 22a to the cut surface by the bit 37 so that the upper surface 1a of the wafer 1 held on the chuck table 20 becomes horizontal.

The variation in thickness of the wafer 1 can be checked by measuring the thickness of the wafer 1 at a plurality of positions (e.g., three positions) with reference to the notch 4 of the wafer 1. In adjusting the angle of the suction surface 22a of the chuck table 20 in the condition where the wafer 1 is held thereon, the chuck table 20 is inclined with reference to the notch 4, thereby setting the upper surface 1a of the wafer 1 to a horizontal surface.

Figure 7:
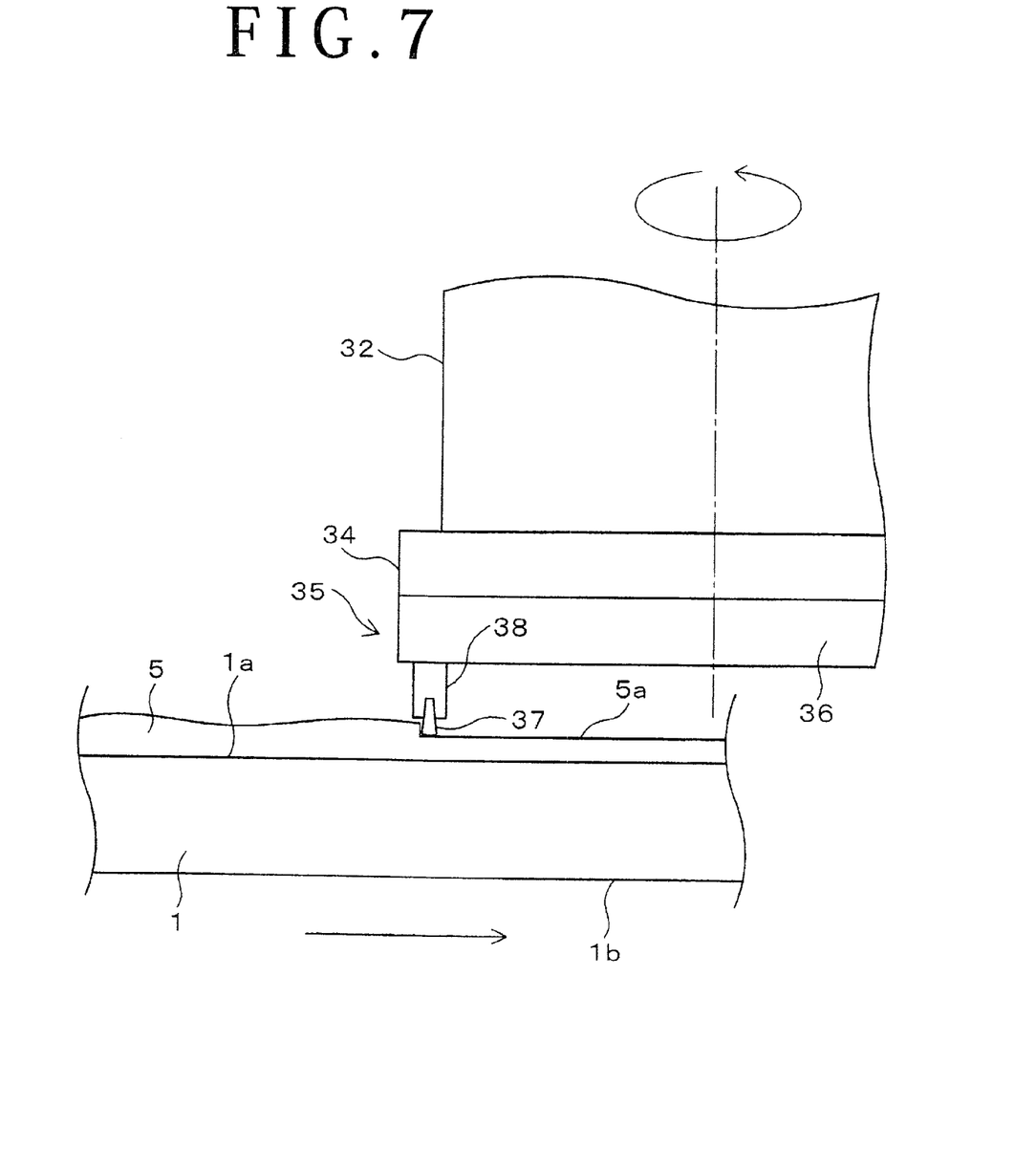
FIG. 7 is an enlarged side view for illustrating a condition where the additional layer formed on the upper surface of the wafer is cut by the cutting unit shown in FIG. 3.

After setting the upper surface 1a of the wafer 1 to a horizontal surface, i.e., setting the upper surface 1a parallel to the cut surface by the bit 37 as mentioned above, the upper surface 5a of the additional layer 5 is cut by the bit 37 of the cutting unit 30 (additional layer cutting step). This cutting step is performed in the following manner. The cutting unit 30 is lowered by the feeding mechanism 54 to such a position that the cutting part of the bit 37 cuts in the additional layer 5 by a predetermined amount (e.g., 2 μm or more), and the cutting tool 35 is rotated by the spindle motor 33. In this condition, the table base 25 is moved toward the rear end of the base 11 in the Y direction to thereby move the wafer 1 held on the chuck table 20 toward the working position below the cutting unit 30. Accordingly, as shown in FIG. 7, the upper surface 5a of the additional layer 5 is continuously cut by the bit 37 rotating about the axis of the spindle shaft 32 in concert with the movement of the table base 25. For example, the rotational speed of the cutting tool 35 is set to about 2000 rpm, and the moving speed of the table base 25, i.e., the work feed speed is set to about 0.5 to 1.5 mm/sec. In this preferred embodiment, the total amount of processing of the additional layer 5 is set to more than 3 μm, and the amount of cutting of the additional layer 5 in the above additional layer cutting step is set to 2 μm or more.

At the time the wafer 1 is moved to a position where it is fully covered with the frame 36, the whole of the upper surface 5a of the additional layer 5 has been cut flat. In the case that the amount of cutting of the upper surface 5a of the additional layer 5 at this time is a required amount, the additional layer cutting step is finished. However, in the case that the required amount of cutting is large, the table base 25 is reciprocated to repeat the above additional layer cutting step according to the required amount.

When the whole of the upper surface 5a of the additional layer 5 is cut by the required amount as shown in FIG. 2C, the cutting unit 30 is lifted to be retracted from the wafer 1, and the table base 25 is then returned to the mount/demount position. At the mount/demount position, the vacuum operation of the chuck table 20 is stopped and as shown in FIG. 3 the wafer 1 is then transported from the chuck table 20 to a spinner type cleaning unit 18 by a recovery arm 17. In the cleaning unit 18, the wafer 1 is cleaned and dried. Thereafter, the wafer 1 is recovered into a recovery cassette 19 by the pickup robot 13. Further, the chuck table 20 kept at the mount/demount position is cleaned by air sprayed from an air nozzle 27 to thereby remove chips or the like from the chuck table 20.

Figure 2E:
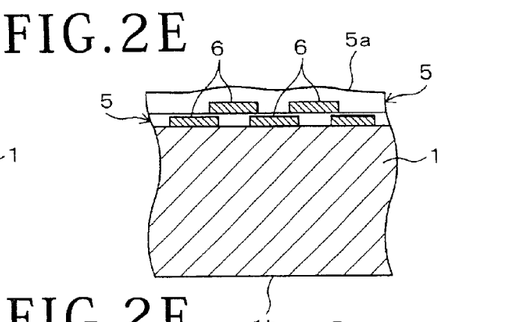
Figure 2F:
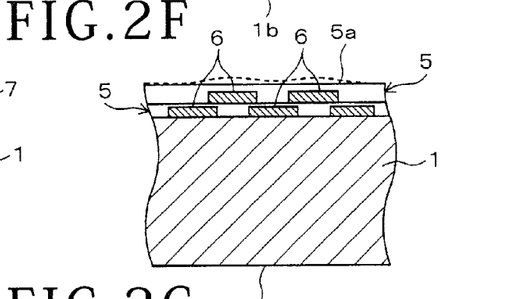

After cutting the additional layer 5 by a predetermined amount, the flat upper surface 5a of the additional layer 5 formed on the upper surface 1a of the wafer 1 is polished as shown in FIG. 2D by using any polishing means such as CMP (additional layer polishing step). In the additional layer polishing step, the remaining amount of processing of the additional layer 5 (e.g., about 1 μm) is removed to finish the upper surface 5a of the additional layer 5 so that the upper surface 5a is planarized and a target thickness of the additional layer 5 is obtained. After performing the additional layer polishing step, a second additional layer 5 is formed on the upper surface 5a of the first additional layer 5 obtained above as shown in FIG. 2E, and the additional layer cutting step and the additional layer polishing step are repeated as shown in FIGS. 2F and 2G to thereby form a multilayer structure composed of the first and second additional layers 5. In the case of forming a multilayer structure composed of three or more additional layers 5, the above steps are further repeated according to the number of additional layers 5. After forming the multilayer structure of the additional layers 5, the back side 1b of the wafer 1 is ground to reduce the thickness of the wafer 1 to a target thickness. Finally, the wafer 1 is cut along all the crossing streets 2, thereby obtaining all the individual semiconductor chips 3.

According to this preferred embodiment, the wafer 1 is held on the chuck table 20 so that the upper surface 1a of the wafer 1 is substantially parallel to the cut surface by the bit 37. In this condition, the additional layer 5 formed on the upper surface 1a of the wafer 1 is cut by the bit 37 in the additional layer cutting step, and next polished in the additional layer polishing step to thereby obtain the flat upper surface 5a of the additional layer 5 having a predetermined thickness. Most of the total amount of processing of the additional layer 5 is removed in the additional layer cutting step, thereby suppressing a processing cost as compared with the case that the additional layer 5 is processed by only polishing such as CMP. Further, the remaining amount of processing of the additional layer 5 is removed in the additional layer polishing step, so that the flatness of the upper surface 5a of the additional layer 5 after polishing can be improved as compared with the case that the upper surface 5a is finished by only the bit 37.

The upper surface 5a of the additional layer 5 covering the upper surface 1a of the wafer 1 is cut to become parallel to the upper surface 1a of the wafer 1. Accordingly, in applying the material of the insulating film 7 to the upper surface 1a of the wafer 1, it is not especially necessary to precisely manage the thickness of the insulating film 7, so that the kind and applying method of the material of the insulating film 7 can be selected relatively freely from the viewpoints of the unevenness of the upper surface 1a, the ease of application of the material, and the costs of the material and application method.

According to this preferred embodiment, the total amount of processing of the additional layer 5 by the additional layer cutting step and the additional layer processing step is set to more than 3 μm, and the amount of cutting of the additional layer 5 by the additional layer cutting step is set to 2 μm or more, thereby reducing the cost. For example, in the case that the total amount of processing of the additional layer 5 is about 1 μm, the processing cost can be suppressed because of such a small processing amount even by only the additional layer polishing step whose processing cost is relatively high. However, in the case that the total processing amount is about 3 μm or more, the processing cost becomes high if only the additional layer polishing step is adopted. Under these circumstances, most of the total amount of processing of the additional layer 5 is removed by the additional layer cutting step whose processing cost is relatively low in the condition where 1 μm is left as the amount of processing of the additional layer 5 by the additional layer polishing step, thereby reducing the cost.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A semiconductor wafer processing method for planarizing an additional layer formed on the front side of a semiconductor wafer, said semiconductor wafer processing method comprising:

a semiconductor wafer holding step of holding said semiconductor wafer by using holding means included in a cutting device in a condition where the front side of said semiconductor wafer is exposed, said cutting device including a rotating member and a cutting member supported to said rotating member, said cutting member forming a cut surface, said holding means having a holding surface on which said semiconductor wafer is held, the angle of said holding surface to said cut surface being adjustable to substantially zero;

an additional layer cutting step of flat cutting said additional layer formed on the front side of said semiconductor wafer by using said cutting member rotating with said rotating member; and an additional layer polishing step of polishing said additional layer after said additional layer cutting step.

2. The semiconductor wafer processing method according to claim 1, wherein the total amount of processing of said additional layer by said additional layer cutting step and said additional layer polishing step is more than 3 μm, and the amount of cutting of said additional layer by said additional layer cutting step is 2 μm or more.

* * * * *

UNITED STATES PATENT AND TRADEMARK OFFICE
CERTIFICATE OF CORRECTION

PATENT NO.         : 7,550,387 B2
APPLICATION NO. : 12/180283
DATED                 : June 23, 2009
INVENTOR(S)       : Kazuma Sekiya

It is certified that error appears in the above-identified patent and that said Letters Patent is hereby corrected as shown below:

On the Title Page:

Insert the following:   --(30) Foreign Application Priority Data;  August 29, 2007; (JP) 2007-222352--.

Signed and Sealed this

Twenty-fourth Day of November, 2009

David J. Kappos
*Director of the United States Patent and Trademark Office*